United States Patent
Brodie

(10) Patent No.: US 10,242,839 B2
(45) Date of Patent: Mar. 26, 2019

(54) REDUCED COULOMB INTERACTIONS IN A MULTI-BEAM COLUMN

(71) Applicant: KLA-Tencor Corporation, Milpitas, CA (US)

(72) Inventor: Alan D. Brodie, Palo Alto, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/587,720

(22) Filed: May 5, 2017

(65) Prior Publication Data
US 2018/0323034 A1   Nov. 8, 2018

(51) Int. Cl.
H01J 37/04   (2006.01)
H01J 37/10   (2006.01)

(52) U.S. Cl.
CPC ............ *H01J 37/045* (2013.01); *H01J 37/10* (2013.01); *H01J 2237/0435* (2013.01)

(58) Field of Classification Search
USPC .................................. 250/307, 396 R, 492.2
See application file for complete search history.

(56) References Cited

U.S. PATENT DOCUMENTS

| | | | |
|---|---|---|---|
| 4,419,182 A * | 12/1983 | Westerberg | H01J 9/02 216/2 |
| 6,768,125 B2 * | 7/2004 | Platzgummer | B82Y 10/00 250/492.1 |
| 6,861,187 B2 * | 3/2005 | Yahiro | H01J 37/28 250/396 R |
| 6,903,353 B2 * | 6/2005 | Muraki | B82Y 10/00 250/396 R |
| 7,214,951 B2 * | 5/2007 | Stengl | B82Y 10/00 250/492.21 |
| 8,134,135 B2 * | 3/2012 | Kruit | H01J 37/12 250/491.1 |
| 8,294,125 B2 * | 10/2012 | Han | G01B 15/00 250/397 |
| 8,362,425 B2 | 1/2013 | Han et al. | |
| 8,618,480 B2 * | 12/2013 | Ren | H01J 37/261 250/310 |
| 2004/0141169 A1 | 7/2004 | Wieland et al. | |
| 2005/0253066 A1 | 11/2005 | Watanabe et al. | |
| 2010/0102227 A1 | 4/2010 | Chen et al. | |
| 2011/0192975 A1 | 8/2011 | Chen | |
| 2017/0025243 A1 | 1/2017 | Ren et al. | |

OTHER PUBLICATIONS

ISA/KR, International Search Report for PCT/US2018/013425 dated May 2, 2018.

* cited by examiner

Primary Examiner — Phillip A Johnston
(74) Attorney, Agent, or Firm — Hodgson Russ LLP

(57) ABSTRACT

Performance of a multi-electron-beam system can be improved by reducing Coulomb effects in the illumination path of a multi-beam inspection system. A beam-limiting aperture with multiple holes can be positioned between an electron beam source and a multi-lens array, such as in a field-free region. The beam-limiting aperture is configured to reduce Coulomb interactions between the electron beam source and the multi-lens array. An electron beam system with the beam-limiting aperture can be used in a scanning electron microscope.

20 Claims, 6 Drawing Sheets

REDUCED COULOMB INTERACTIONS IN A MULTI-BEAM COLUMN

FIELD OF THE DISCLOSURE

This disclosure relates to electron beam systems.

BACKGROUND OF THE DISCLOSURE

Previous electron beam inspection systems generated an electron beam by a Schottky thermal field electron emitter. Surrounding the emitter was a suppressor electrode, which suppressed unwanted thermal electrons from the shank of the emitter from getting into the primary beam. A voltage on the extractor electrode determined the electric field at the apex of the tip. The field at the tip determined the amount of current that could be extracted from the tip. A second electrode or anode after the extractor was typically used to accelerate the beam to the desired energy. The current distribution from the emitter extended to several degrees. In an electron beam inspection system, small source acceptance angles of less than one degree may be required for high resolution. In a scanning electron microscope (SEM), a spray aperture is typically used to block unused electrons. A second aperture farther down the column can act as a pupil aperture, which sets a numerical aperture (NA) of the objective lens. Such a design still has problems with Coulomb effects.

Therefore, what is needed is an improved electron beam system.

BRIEF SUMMARY OF THE DISCLOSURE

In a first embodiment, an electron beam system is provided. The electron beam system comprises an electron beam source; a multi-lens array; and a beam-limiting aperture that defines a plurality of holes. The beam-limiting aperture is disposed between the electron beam source and the multi-lens array. The beam-limiting aperture is configured to reduce Coulomb interactions between the electron beam source and the multi-lens array. The beam-limiting aperture can be fabricated of silicon, a metal, or a metal alloy. The electron beam source can include an emitter, suppressor, and extractor.

The beam-limiting aperture can be disposed at a position between the electron beam source and the multi-lens array that has a field of less than 1 V/mm. For example, the position between the electron beam source and the multi-lens array can be field-free.

The beam-limiting aperture may define at least six of the holes. The beam-limiting aperture can define the holes to each have a diameter from 1 µm to 100 µm. For example, the diameter for each of the holes may be 50 µm. The beam-limiting aperture can define the holes to have a pitch from 2 µm to 100 µm. For example, the pitch may be 100 µm. The beam-limiting aperture can define the holes to each be round. The holes can be disposed in the beam-limiting aperture in a polygon arrangement.

A scanning electron microscope can comprise the electron beam system of any of the design variations or examples of the first embodiment.

A method is provided in a second embodiment. The method comprises generating an electron beam; extracting the electron beam; directing the electron beam through a beam-limiting aperture that defines a plurality of holes; and directing the electron beam through a multi-lens array positioned downstream of the beam-limiting aperture with respect to a projection direction of the electron beam. The beam-limiting aperture is configured to reduce Coulomb interactions between the electron beam source and the multi-lens array.

The electron beam can be in a region that has a field of less than 1 V/mm when the electron beam passes through the beam-limiting aperture. For example, the region may be a field-free region.

The electron beam that passes through the multi-lens array can be focused to a diameter of 50 nm.

A system is provided in a third embodiment. The system comprises an electron beam source configured to generate an electron beam; a multi-lens array positioned upstream of a wafer; a beam-limiting aperture that defines a plurality of holes; and a detector configured to detect electrons from the electron beam returned from a surface of the wafer. The beam-limiting aperture is disposed between the electron beam source and the multi-lens array. The beam-limiting aperture is configured to reduce Coulomb interactions between the electron beam source and the multi-lens array.

The beam-limiting aperture can be disposed at a position between the electron beam source and the multi-lens array that has a field of less than 1 V/mm. For example, the position between the electron beam source and the multi-lens array may be field-free.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein improve the performance of a multi-electron-beam system by reducing Coulomb effects in the illumination path of a multi-beam inspection system. A beam limiting aperture (BLA) can be used block unused electrons from continuing downstream, such as to prevent charging and/or gas ionization. The BLA can help reduce Coulomb effects. As electrons travel through an electron optical column, the electrons interact with each other as described by Coulomb's law because the electrons are charged particles. The cumulative effect of the number of electrons in the electron column and the length of time the electrons spend in the electron column determines the magnitude of the Coulomb effects. Introducing a BLA in the beam path close to the electron source removes electrons so there are fewer electrons in the electron optical column during a majority of the electron path. Since there are fewer electrons, the magnitude of the Coulomb effects may be reduced.

Figure 1:
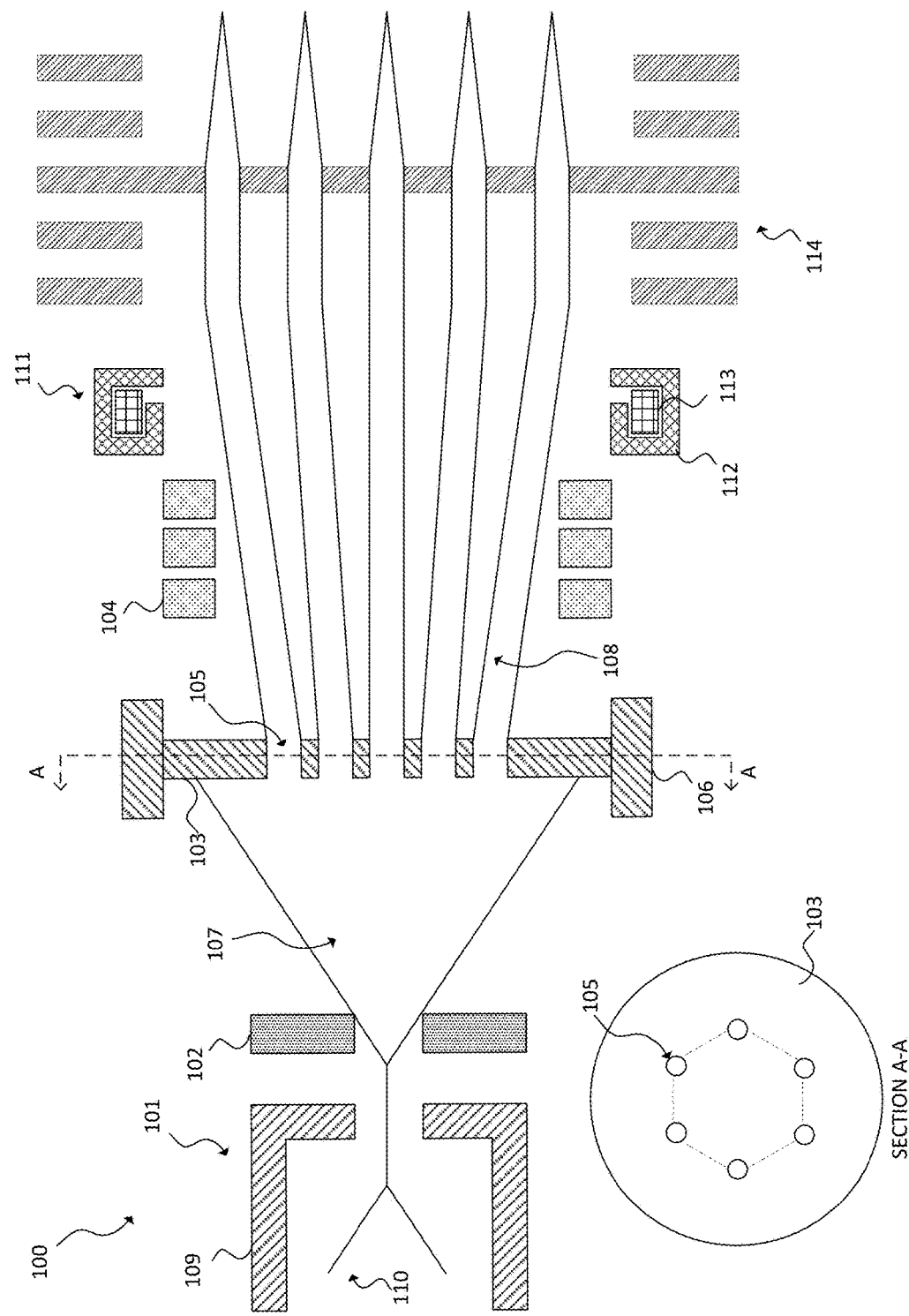
FIG. 1 is a schematic diagram of an embodiment of an electron beam system in accordance with the present disclosure.
Figure 2:
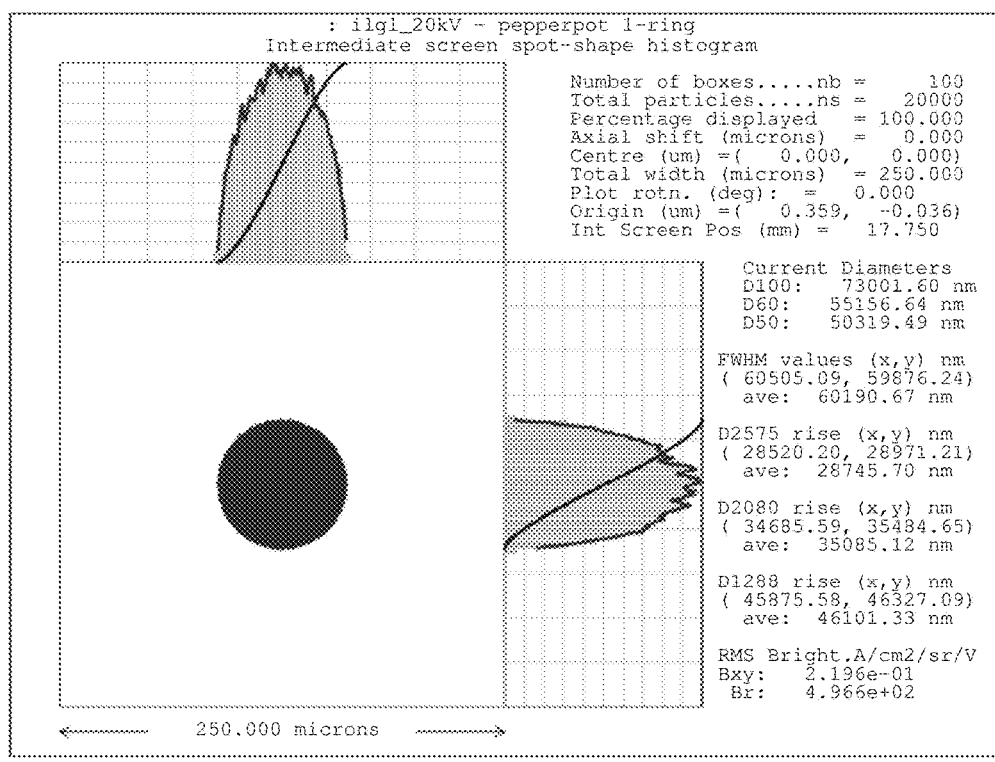
FIG. 2 is a first electron beam histogram.

FIG. 1 is a schematic diagram of an embodiment of an electron beam system 100. The electron beam system 100 includes an electron beam source 101, a beam-limiting aperture (BLA) 103, and a multi-lens array (MLA) 104. The electron beam source 101 can include an emitter 109, suppressor 110, and extractor 102.

The BLA 103 may be positioned proximate the electron beam source 101 to reduce space-charge effects. In an instance, the BLA 103 is in an electric field free region as close as possible to extractor 102 as possible. This may be slightly below an anode 106, which is at ground potential.

The BLA 103 may be fabricated of silicon, a metal, a metal alloy, or another material that provides acceptable power and/or heat dissipation. The material of the BLA 103 may resist melting or distortion caused by heat. The BLA 103 may be connected to the anode 106. The BLA 103 may have a thickness from 2 μm to 25 μm, though other dimensions are possible.

The BLA 103 maybe referred to a "pepper pot" BLA. The BLA 103 in FIG. 1 defines multiple holes 105 through the BLA 103. The BLA 103 may include from one hole 105 to 2,000 or 3,000 holes 103, including all ranges and values between. In an instance, the BLA 103 defines six or seven holes 105. More or fewer holes 105 may be included in the BLA 103.

Each hole 105 may have a diameter from 1 μm to 100 μm, including all values to the 0.5 μm and ranges between. In an instance, each hole 105 has a diameter of 50 μm. In another instance, each hole 105 has a diameter from 1 μm to 10 μm, including all values to the 0.5 μm and ranges between. The holes 105 may be slightly oversized relative to the size of the electron beam so that the illumination overfills the pupil aperture of the MLA 104. The BLA 103 also can serve as a shield that blocks part of the electron beam.

The holes 105 may be positioned in the BLA 103 to have a pitch from 2 μm to 100 μm, including all values to the 0.5 μm and ranges between. In an instance, the pitch of the holes 105 in the BLA 103 is 100 μm.

The inset of FIG. 1, which is not drawn to scale with the rest of FIG. 1, is an example of a front view of the BLA 103 taken along lines A-A. Each of the holes 105 may be round, polygonal, or other shapes. The six holes 105 are arranged in a polygon pattern (shown with a dotted line).

In another instance, the BLA 103 defines seven of the holes 105 in a polygon arrangement. In yet another instance, the BLA 103 defines approximately 1,000 holes 105. In an example of a BLA 103 for inspection, the BLA 103 includes 331 holes 105.

Arranging the holes 105 in the BLA 103 in a polygon pattern may be beneficial because the holes 105 will be arranged in a manner approximating a circle. The electron optics used in an electron beam inspection system can be rotationally symmetric. To optimize the area in the macroscopic electron lenses, a pattern that approximates a circle may be desired.

An electron beam 107 that is generated by the electron beam source 101 is turned into a plurality of beamlets 108 by the BLA 103 as the electron beam 107 passes through the holes 105 of the BLA 103. Each hole 105 produces one beamlet 108. Each beamlet 108 may be approximately 50 nm in diameter leaving the BLA 103. The design of the electron beam system 100 may provide multiple small beamlets 108 that are spread apart from one another. A remainder of the electron beam 107 is blocked by the BLA 103.

The MLA 104 includes a 2D array of lenses. An individual lens in the MLA 104 can have more holes along the optic axis or third axis for that particular lens. In an instance, there is one-to-one mapping of holes in the lenses of the MLA 104 and the holes 105 in the BLA 103.

A multi-beam system is created by flood illuminating the MLA 104, which may be electrostatic. An electrostatic lens is formed by putting an electric field across an aperture of the MLA 104. Each individual lens makes an image of the electron beam source 101 at the virtual source plane that is then de-magnified onto a wafer. To illuminate the MLA 104, a large illumination angle may be required from the source. For example, this illumination angle may be up to two degrees, though other values are possible.

The BLA 103 is positioned between the electron beam source 101 and the MLA 104. The BLA 103 can be located between the electron beam source 101 and the MLA 104 in a region or position that is less than 1 V/mm or is field-free, which means there may be minimal or even no lensing effect by the holes 105. Thus, the BLA 103 may not focus the beamlets 108. Field-free may mean 0 V/mm, but can be other values near 0 V/mm where a lensing effect does not occur. Positioning the BLA 103 between the electron beam source 101 and the MLA 104 can reduce Coulomb interactions in this region. In doing so, the BLA 103 may not act as an optical component, which reduces tolerance requirements. In an example, electron beam current delivered to a wafer can be doubled, tripled, or quadrupled at a resolution from approximately 3 nm to 10 nm.

Electron interactions and Coulomb interactions can cause problems. For example, these interactions can increase blur caused by chromatic aberrations or dispersion. It may not be possible to correct lateral blur. The BLA 103 is configured to reduce Coulomb interactions between the electron beam source 101 and the MLA 104. Separation of the beamlets 108 can further improve performance by reducing crosstalk.

In an instance, the emitter 109 operates at $-V_E$, the extractor 102 operates at $-V_{ext}$, the suppressor 110 operates at $-V_S$ (e.g., $-V_E-1000$ V), and the anode operates at 0 V. A voltage also may be applied to the MLA 104. For example, $-V_E$ is from 6000 V to 30,000 V and $-V_{ext}$ is $-V_E$ plus from 3000 V to 7000 V.

Downstream of the MLA 104 with respect to the direction of the electron beam or beamlets 108 is a magnetic lens 111 with at least one coil 113 and pole-pieces 112. Elements 114 adjust the trajectory, focus, and/or size of the beamlets 108.

The electron beam system 100 can be used in, for example, an SEM or other devices.

Figure 3:
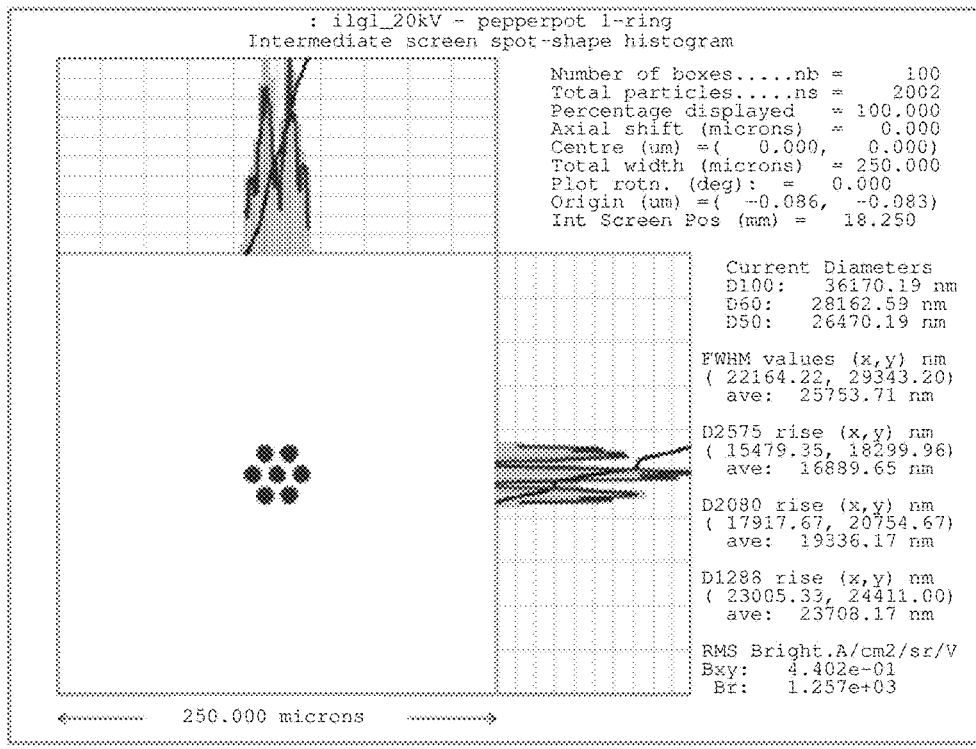
FIG. 3 is a second electron beam histogram.
Figure 4:
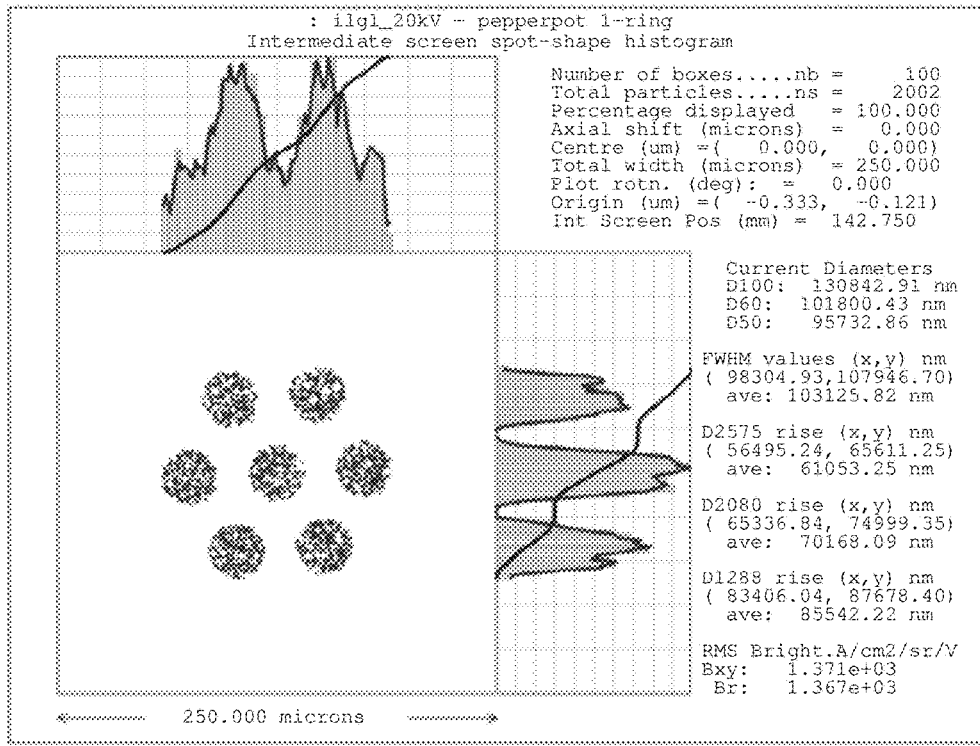
FIG. 4 is a third electron beam histogram.
Figure 5:
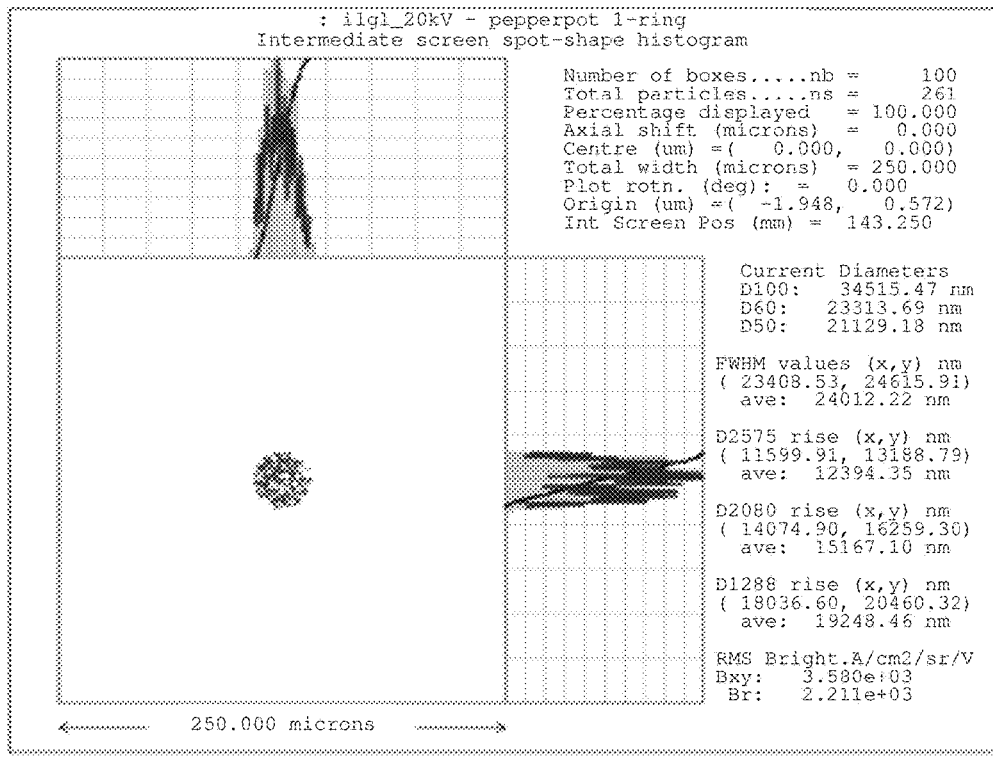
FIG. 5 is a fourth electron beam histogram.
Figure 6:
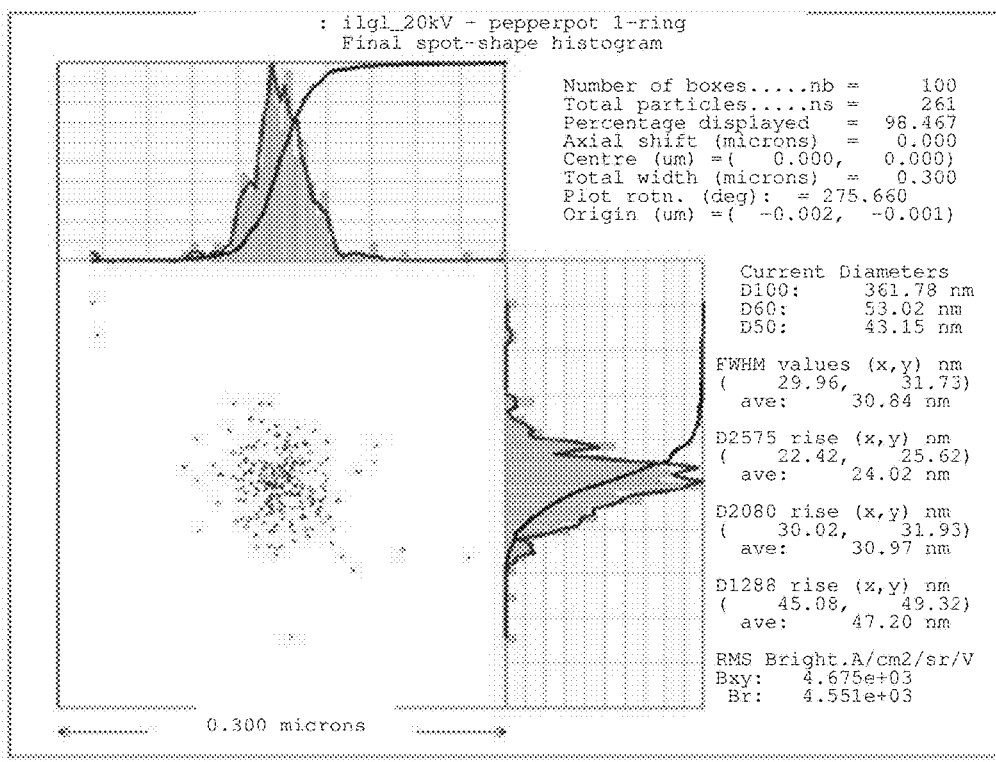
FIG. 6 is a fifth electron beam histogram.
Figure 7:
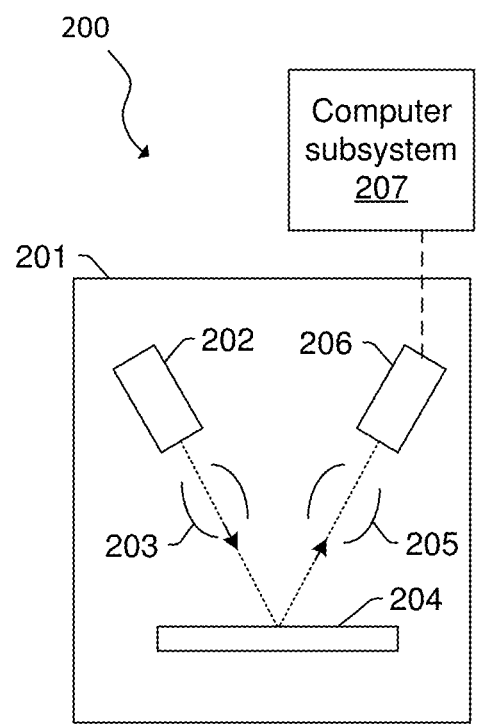
FIG. 7 is an embodiment of a system in accordance with the present disclosure.

FIGS. 2-6 are electron beam histograms from Monte Carlo simulations. FIG. 3 shows a 250 μm electron beam upstream of the BLA. FIG. 4 shows the electron beam downstream of the BLA. FIG. 5 shows the electron beam upstream the MLA. FIG. 6 shows the electron beam downstream of the MLA. FIG. 7 shows an intermediate image of the electron beam. Use of the BLA, as disclosed herein, reduces the Coulomb blur as shown by simulations in FIGS. 3-7. The center electron beam blur is reduced from D2080=31 nm compared to 49 nm without the BLA. The total current is reduced from 16.1 nA without the BLA to 6.3 nA with the BLA. As seen in these simulations, the BLA can provide improved performance that is nearly twice as good as a system without the BLA.

The embodiments described herein may include or may be performed in a system, such as the system 200 of FIG. 7. The system 200 includes an output acquisition subsystem that includes at least an energy source and a detector. The output acquisition subsystem may be an electron beam-based output acquisition subsystem. For example, in one embodiment, the energy directed to the wafer 204 includes electrons, and the energy detected from the wafer 204 includes electrons. In this manner, the energy source may be an electron beam source 202, which can include or be coupled with an electron beam system as disclosed herein. In one such embodiment shown in FIG. 7, the output acquisition subsystem includes electron optical column 201, which is coupled to computer subsystem 207.

As also shown in FIG. 7, the electron optical column 201 includes electron beam source 202 configured to generate electrons that are focused to wafer 204 by one or more elements 203. The electron beam source 202 may include an emitter and one or more elements 203 may include, for example, a gun lens, an anode, a BLA, an MLA, a gate valve, a beam current selection aperture, an objective lens, and/or a scanning subsystem. The electron column 201 may include any other suitable elements known in the art. While only one electron beam source 202 is illustrated, the system 200 may include multiple electron beam sources 202.

Electrons returned from the wafer 204 (e.g., secondary electrons) may be focused by one or more elements 205 to detector 206. One or more elements 205 may include, for example, a scanning subsystem, which may be the same scanning subsystem included in element(s) 203. The electron column 201 may include any other suitable elements known in the art.

Although the electron column 201 is shown in FIG. 7 as being configured such that the electrons are directed to the wafer 204 at an oblique angle of incidence and are scattered from the wafer at another oblique angle, it is to be understood that the electron beam may be directed to and scattered from the wafer at any suitable angle. In addition, the electron beam-based output acquisition subsystem may be configured to use multiple modes to generate images of the wafer 204 (e.g., with different illumination angles, collection angles, etc.). The multiple modes of the electron beam-based output acquisition subsystem may be different in any image generation parameters of the output acquisition subsystem.

Computer subsystem 207 may be in electronic communication with the detector 206. The detector 206 may detect electrons returned from the surface of the wafer 204 thereby forming electron beam images of the wafer 204. The electron beam images may include any suitable electron beam images. Computer subsystem 207 may be configured to perform other functions or additional steps using the output of the detector 206 and/or the electron beam images.

It is noted that FIG. 7 is provided herein to generally illustrate a configuration of an electron beam-based output acquisition subsystem. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system).

In one embodiment, the system 200 is an inspection system. For example, the electron beam output acquisition subsystems described herein may be configured as inspection systems. In another embodiment, the system 200 is a defect review system. For example, the electron beam output acquisition subsystems described herein may be configured as defect review systems. In a further embodiment, the system 200 is a metrology system. For example, the electron beam output acquisition subsystems described herein may be configured as metrology systems. In particular, the embodiments of the system 200 described herein and shown in FIG. 7 may be modified in one or more parameters to provide different imaging capability depending on the application for which they will be used. In one such example, the system 200 shown in FIG. 7 may be configured to have a higher resolution if it is to be used for defect review or metrology rather than for inspection. In other words, the embodiment of the system 200 shown in FIG. 7 describe some general and various configurations for an system 200 that can be tailored in a number of manners to produce output acquisition subsystems having different imaging capabilities that are more or less suitable for different applications.

In particular, the embodiments described herein may be installed on a computer node or computer cluster that is a component of or coupled to an output acquisition subsystem such as an electron beam inspector or defect review tool, a mask inspector, a virtual inspector, or other devices. In this manner, the embodiments described herein may generate output that can be used for a variety of applications that include, but are not limited to, wafer inspection, mask inspection, electron beam inspection and review, metrology, or other applications. The characteristics of the system 200 shown in FIG. 7 can be modified as described above based on the specimen for which it will generate output.

Figure 8:
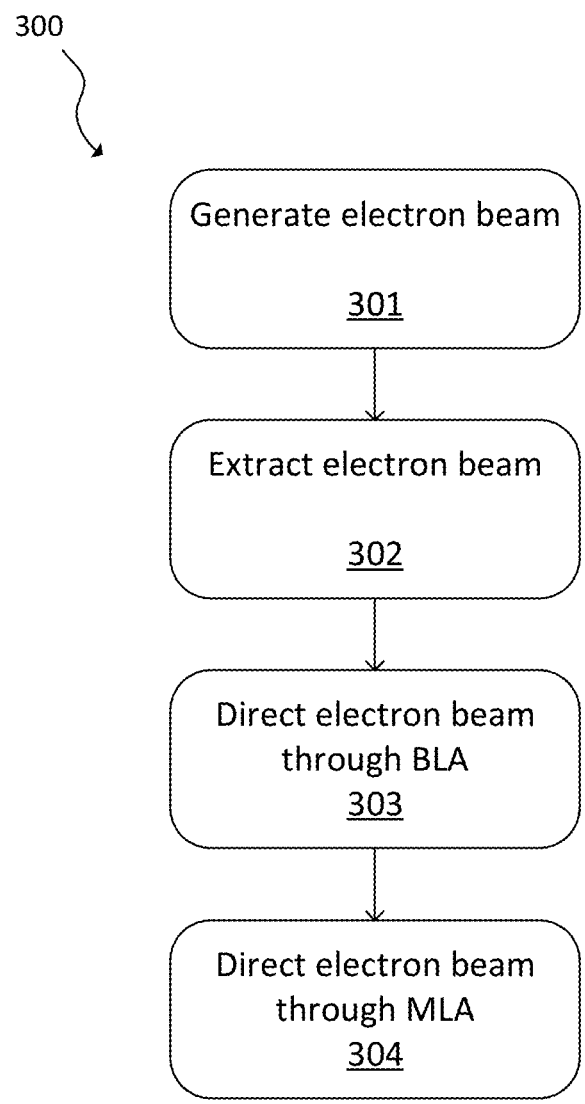
FIG. 8 is a flowchart of a method in accordance with the present disclosure.

FIG. 8 is a flowchart of a method 300. An electron beam is generated 301, extracted 302, directed through a BLA 303, and directed through an MLA 304 downstream of the BLA with respect to a projection direction of the electron beam. The BLA defines multiple holes. The BLA is configured to reduce Coulomb interactions between the electron beam source and the multi-lens array. The electron beam may be in a region of less than 1 V/mm or a field-free region when the electron beam passes through the BLA. The electron beam that passes through the MLA may be focused to a diameter of, for example, 50 nm.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. An electron beam system comprising:
    an electron beam source;
    a multi-lens array;

a beam-limiting aperture that defines a plurality of holes, wherein the beam-limiting aperture is disposed between the electron beam source and the multi-lens array, and wherein the beam-limiting aperture is configured to reduce beam blur between the electron beam source and the multi-lens array;

elements on the opposite side of the multi-lens array from the electron source, wherein the elements are configured to adjust focal length of beamlets from the multi-lens array; and a magnetic lens disposed between the multi-lens array and the elements.

2. The electron beam system of claim 1, wherein the beam-limiting aperture is disposed at a position between the electron beam source and the multi-lens array that has a field of less than 1 V/mm.

3. The electron beam system of claim 2, wherein the position between the electron beam source and the multi-lens array is field-free.

4. The electron beam system of claim 1, wherein the beam-limiting aperture defines at least six of the holes.

5. The electron beam system of claim 1, wherein the electron beam source includes an emitter, suppressor, and extractor.

6. The electron beam system of claim 1, wherein the beam-limiting aperture defines the holes to each have a diameter from 1 μm to 100 μm.

7. The electron beam system of claim 6, wherein the diameter for each of the holes is 50 μm.

8. The electron beam system of claim 1, wherein the beam-limiting aperture defines the holes to have a pitch from 2 μm to 100 μm.

9. The electron beam system of claim 8, wherein the pitch is 100 μm.

10. The electron beam system of claim 1, wherein the beam-limiting aperture is fabricated of silicon, a metal, or a metal alloy.

11. The electron beam system of claim 1, wherein the beam-limiting aperture defines the holes to each be round.

12. The electron beam system of claim 1, wherein the holes are disposed in the beam-limiting aperture in a polygon arrangement.

13. A scanning electron microscope comprising the electron beam system of claim 1.

14. A method comprising:
generating an electron beam;
extracting the electron beam;
directing the electron beam through a beam-limiting aperture that defines a plurality of holes;
directing the electron beam through a multi-lens array positioned downstream of the beam-limiting aperture with respect to a projection direction of the electron beam, wherein the beam-limiting aperture is configured to reduce beam blur between the electron beam source and the multi-lens array;
directing the electron beam through a magnetic lens positioned downstream of the multi-lens array with respect to the projection direction of the electron beam; and
directing the electron beam through elements positioned downstream of the magnetic lens with respect to the projection direction of the electron beam, wherein the elements are configured to adjust focal length of beamlets from the magnetic lens.

15. The method of claim 14, wherein the electron beam is in a region that has a field of less than 1 V/mm when the electron beam passes through the beam-limiting aperture.

16. The method of claim 15, wherein the region is a field-free region.

17. The method of claim 14, wherein the electron beam that passes through the multi-lens array is focused to a diameter of 50 nm.

18. A system comprising:
an electron beam source configured to generate an electron beam;
a multi-lens array positioned upstream of a wafer;
a beam-limiting aperture that defines a plurality of holes, wherein the beam-limiting aperture is disposed between the electron beam source and the multi-lens array, and wherein the beam-limiting aperture is configured to reduce beam blur between the electron beam source and the multi-lens array;
elements on the opposite side of the multi-lens array from the electron source, wherein the elements are configured to adjust focal length of beamlets from the multi-lens array;
a magnetic lens disposed between the multi-lens array and the elements; and
a detector configured to detect electrons from the electron beam returned from a surface of the wafer.

19. The system of claim 18, wherein the beam-limiting aperture is disposed at a position between the electron beam source and the multi-lens array that has a field of less than 1 V/mm.

20. The system of claim 19, wherein the position between the electron beam source and the multi-lens array is field-free.

* * * * *